United States Patent [19]

Bernardini

[11] Patent Number: 5,941,735
[45] Date of Patent: *Aug. 24, 1999

[54] PRESS-FIT FUSE OR COMPONENT HOLDER

[75] Inventor: Allen J. Bernardini, Southbury, Conn.

[73] Assignee: Litton Systems, Inc., Watertown, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/662,210

[22] Filed: Jun. 12, 1996

[51] Int. Cl.$^6$ .................................................. H01R 33/00
[52] U.S. Cl. ............................................................ 439/698
[58] Field of Search ................................ 439/71, 68, 751, 439/82, 698, 637, 830, 239, 78, 500, 84

[56] References Cited

U.S. PATENT DOCUMENTS

| | | |
|---|---|---|
| 3,813,637 | 5/1974 | Grebik et al. ............................ 439/698 |
| 4,191,440 | 3/1980 | Schramm ................................... 439/82 |
| 4,747,784 | 5/1988 | Cedrone ..................................... 439/71 |
| 5,147,228 | 9/1992 | Miller et al. .............................. 439/78 |
| 5,211,579 | 5/1993 | Seong et al. ............................. 439/698 |
| 5,395,263 | 3/1995 | Sandell ..................................... 439/500 |
| 5,667,412 | 9/1997 | Takahashi et al. ........................ 439/82 |
| 5,820,406 | 10/1998 | Hetherington .......................... 439/500 |
| 5,879,203 | 3/1999 | Egle et al. ............................... 439/739 |

*Primary Examiner*—Neil Abrams
*Assistant Examiner*—Michael C. Zarroli
*Attorney, Agent, or Firm*—Michael H. Wallach

[57] ABSTRACT

A holder for an electrical or electronic component includes a body formed of electrically non-conductive material having a recess to receive a component such as a fuse. At least two laterally spaced electrically conductive contacts are accommodated by the body. Each contact includes at least one aperture engaging section extending beyond a surface of the body to form a solderless low resistance electrical and mechanical connection with a plated through-hole in a printed circuit board or the like and a terminal section to contact a terminal of a component received by the body.

30 Claims, 3 Drawing Sheets

PRESS-FIT FUSE OR COMPONENT HOLDER

FIELD OF THE INVENTION

The present invention relates to holders for electrical or electronic components and in particular to a press-fit fuse or component holder to establish a mechanical and electrical connection between the fuse or component and a printed circuit board or the like.

BACKGROUND OF THE INVENTION

Printed circuit boards or the like on which electrical and/or electronic components are mounted are well known in the art. Conventional printed circuit boards typically include plated through-holes therein through which the metallic pins of the components are inserted. Once inserted, the metallic pins are soldered to the printed circuit board to establish mechanical and electrical connections between the components and the printed circuit boards. Unfortunately, this poses problems in that if a component fails, it is necessary to desolder the component, clean the surface of the printed circuit board and then resolder a replacement component to the printed circuit board. As will be appreciated, this is a difficult and time consuming process even for the very skilled.

It is therefore an object of the present invention to provide a novel press-fit fuse or component holder which may be press-fit to a printed circuit board or the like to provide simultaneously a mechanical and electrical connection to the printed circuit board.

SUMMARY OF THE INVENTION

According to one aspect of the present invention there is provided a holder for an electrical or electronic component comprising:

an insulated body to receive a component; and at least two laterally spaced electrically conductive contacts accommodated by said body, each of said contacts including at least one aperture engaging section extending beyond a surface of said body to form a solderless electrical and mechanical connection with a plated through-hole in a printed circuit board or the like and a terminal section to contact a terminal of a component received by said body.

In one form, the body is formed of plastic material. An elongate recess is provided in the upper surface of the body to receive the component. An access in the form of a notch or window is provided in at least one of the side walls of the body adjacent the recess to facilitate removal of a component accommodated by the recess.

Preferably, the terminal sections of the contacts are resilient and compress when a component is accommodated by the holder so that the restoring forces presented on the terminal sections when compressed, maintain contact between the terminal sections and the terminals of the component. In one embodiment, the aperture engaging sections of the contacts include C-shaped sections formed by oppositely extending arcuate arms which taper in reduced cross-sectional thickness towards their ends. The tapering arms provide uniformly stressed beam sections which allow the outer diameter of the C-shaped sections to conform better to the inside diameter of the plated holes into which the contacts are inserted.

According to another aspect of the present invention there is provided a holder for an electrical or electronic component comprising:

an insulated body having a recess therein to receive a component;

at least two laterally spaced electrically conductive contacts accommodated by said body, each of said contacts including at least one aperture engaging section extending beyond a surface of said body to form a solderless electrical and mechanical connection with a plated through-hole in a printed circuit board or the like and a terminal section adjacent an end of said recess to contact a terminal of a component; and biasing means acting on said terminal sections to urge said terminal sections against a terminal of a component received by said body According to another aspect of the present invention there is provided a holder for an electrical or electronic component comprising:

an insulated body having a recess therein to receive a component;

at least one access provided in a wall of said body adjacent said recess to facilitate removal of a component from said recess; and at least two laterally spaced electrically conductive contacts accommodated by said body, each of said contacts including at least one aperture engaging section extending beyond a surface of said body to form a solderless electrical and mechanical connection with a plated through-hole in a printed circuit board or the like and a terminal section adjacent an end of said recess to contact a terminal of a component received by said body.

The present invention provides advantages in that the holder is easily and inexpensively manufactured while allowing components to be quickly and easily removed and replaced. Also, the design of the contacts allows the holder to form a secure mechanical and low resistance electrical connection with plated holes in a printed circuit board or the like without requiring solder and without deforming the plated holes.

BRIEF DESCRIPTION OF THE DRAWINGS

An embodiment of the present invention will now be described more fully with reference to the accompanying drawings in which.

DESCRIPTION OF THE PREFERRED EMBODIMENTS

Figure 1:
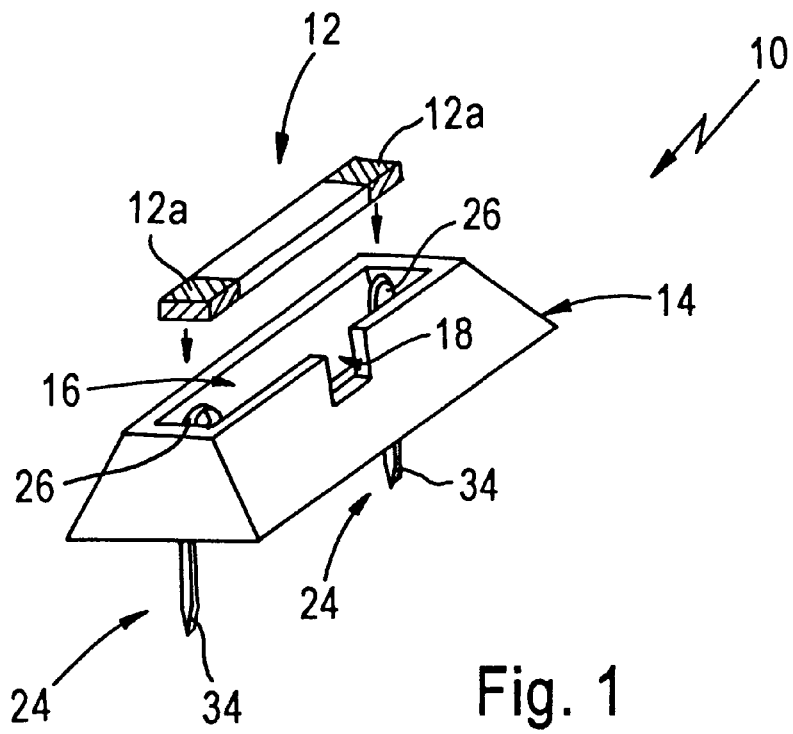
FIG. 1 is a perspective view of a holder for an electrical or electronic component in accordance with the present invention in combination with a fuse.

Referring now to FIGS. 1 to 5, a holder for an electrical or electronic component is shown and is generally indicated to by reference numeral 10. In the particular embodiment illustrated in these Figures, the holder 10 is designed to retain releasably a component in the form of a surface mount fuse 12.

Holder 10 includes a unitary insulated body 14 formed of electrically non-conductive material such as for example, plastic. In this particular embodiment, body 14 is generally trapezoidal and has an elongate rectangular recess 16 provided in its upper surface. Body 14 may however be square, rectangular or other convenient shape. An access in the form of a notch 18 is provided in a sidewall of the body 14 intermediate its length to provide access to the recess 16 and facilitate removal of the fuse 12 therefrom.

A pair of laterally spaced, electrically conductive contacts 20 are accommodated by the body 14 adjacent opposed ends of the recess 16. Each contact 20 includes a terminal section 22 positioned within the recess 16 to contact a terminal 12a of the fuse 12 and an aperture engaging section 24. The aperture engaging section 24 of each contact 20 passes through a hole in the base of the body 14 and extends beyond the base to form a solderless mechanical and low resistance electrical connection with a plated through-hole in a printed circuit board or the like.

Figure 2:
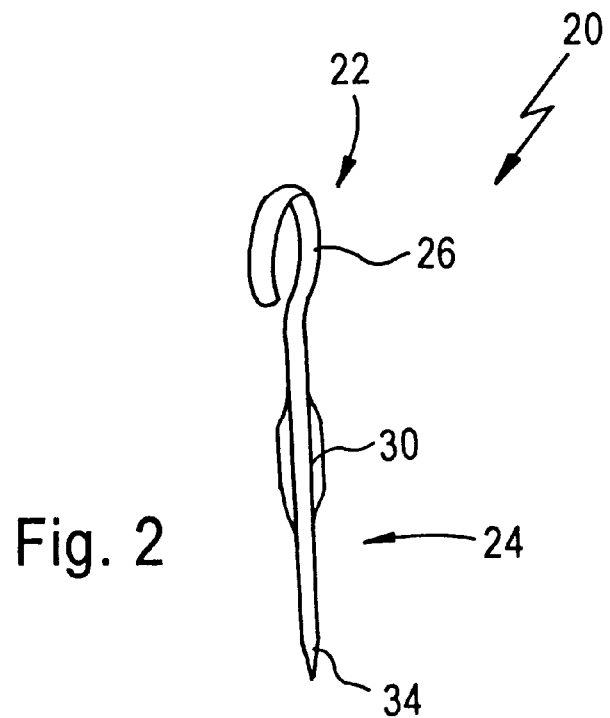
FIG. 2 is perspective view of a contact forming part of the holder of FIG. 1.
Figure 3:
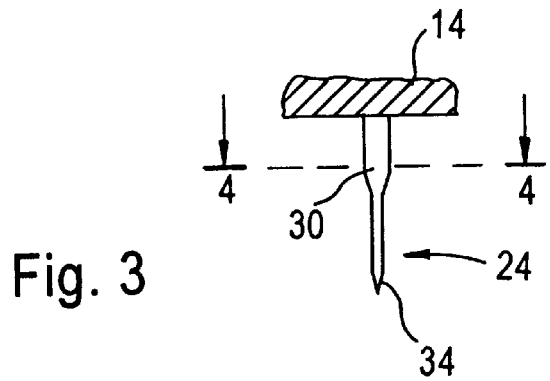
FIG. 3 is a partial cross-sectional view of the holder of FIG. 1.
Figure 4:
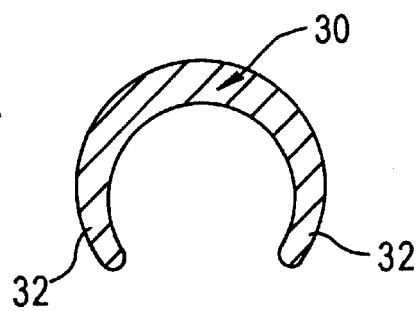
FIG. 4 is an enlarged cross-sectional view of FIG. 3 taken along line 4—4.

Referring to FIG. 2, one of the contacts 20 is better illustrated. As can be seen, the terminal section 22 of the contact 20 is in the form of an open loop 26 designed to compress when in contact with a terminal 12a of the fuse 12. The loop 26 is resilient so that a restoring force is presented on the loop when compressed to bias the loop against the fuse 12 and maintain a good electrical connection between the contact and the fuse.

The aperture engaging section 24 of each contact 20 is of a configuration similar to the central portion and tails of the solderless electrical contacts shown in U.S. Pat. No. 4,017,143 to Knowles and assigned to Litton Systems, Inc., the content of which is incorporated herein by reference. Specifically, the aperture engaging section 24 has an upper C-shaped section 30 formed by oppositely extending arcuate arms 32 which taper in reduced cross-sectional thickness towards their ends. A tail 34 extends downwardly from the C-shaped section 30. The tapering arms 32 provide generally uniformly stressed beam sections which allow the outer diameter of the C-shaped section 30 to conform better to the inside diameter of the plated through-hole into which the aperture engaging sections 24 are inserted.

Figure 5:
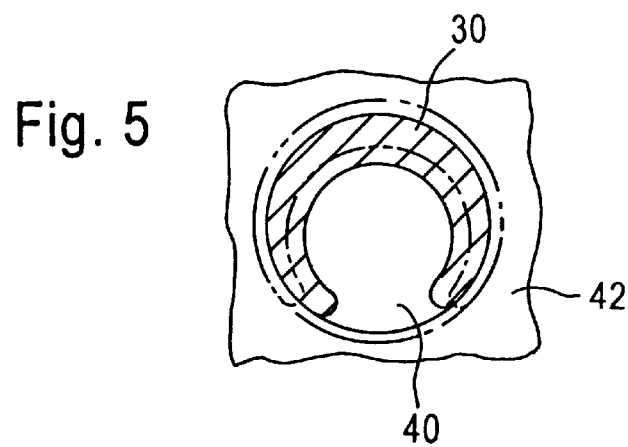
FIG. 5 is an enlarged cross-sectional view of a portion of the holder of FIG. 1 inserted into a plated hole in a printed circuit board.

As will be appreciated by one of skill in the art, when the aperture engaging sections 24 of the contacts 20 are inserted into plated through-holes 40 in a printed circuit board 42 or the like (as shown in FIG. 5), the C-shaped sections 30 conform to the inside diameter of the plated through-holes and form a solderless low resistance electrical and mechanical connection between the contacts 20 and a circuit on the printed circuit board. The fuse 12 which is received by the recess 16, is electrically introduced into the circuit on the printed circuit board via contacts 20. Should the fuse 12 open circuit as a result of an overload or fault condition, the fuse 12 can be easily removed from the recess 16 by way of the notch 18 and replaced with a new fuse.

Although FIG. 1 shows the holder 10 with a fuse 12, those of skill in the art will appreciate that other electrical or electronic components may be accommodated by the holder to allow the components to be releasably connected both mechanically and electrically to a circuit on the printed circuit board. The shape of the body 14 may of course have to be altered to accommodate the component depending on the profile and physical dimensions of the component.

Although the body 14 of the holder 10 has been described as being of unitary construction and formed from a single piece of electrically non-conductive plastic material, it should be appreciated that body may be formed from separate pieces joined together by fusion, adhesive or other suitable means. Also, the body may be formed of any suitable non-conductive material. In addition, if desired, a plurality of notches or windows can be provided in the walls of the body to facilitate removal of the component.

Figure 6:
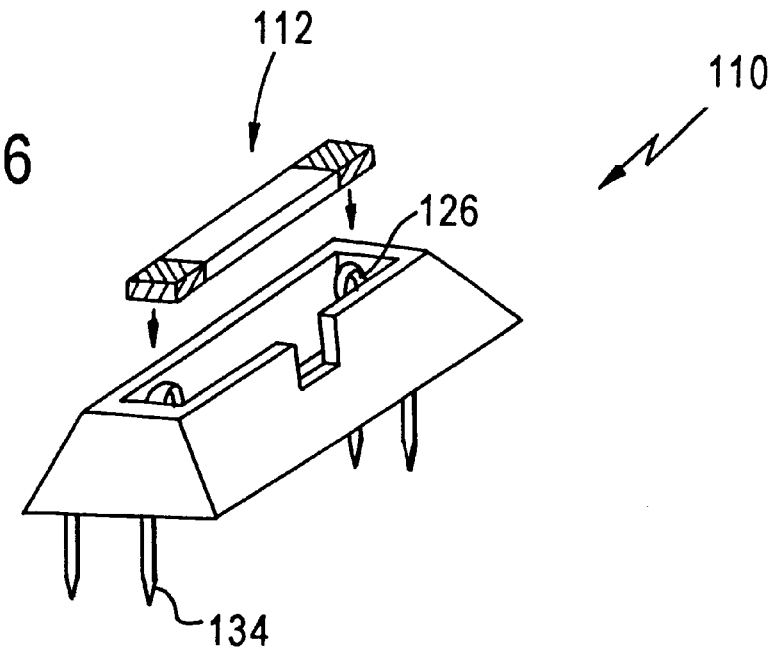
FIG. 6 is a perspective view of another embodiment of a holder for an electrical or electronic component in accordance with the present invention.
Figure 7:
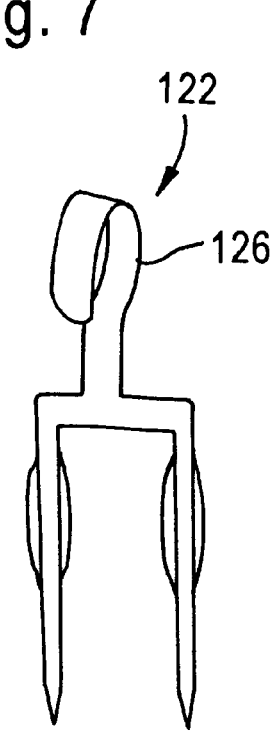
FIG. 7 is a perspective view of a contact forming part of the holder of FIG. 6.

Referring now to FIGS. 6 and 7, an alternative embodiment of a holder for an electrical or electronic component is shown. In this embodiment, like reference numerals will be used to indicate like components of the previous embodiment with a "100" added for clarity. As can be seen, each of the contacts 120 includes a pair of aperture engaging sections 124 joined to a terminal section 122. The dimensions of the terminal section 122 are larger than those of the previous embodiment. The pair of aperture engaging sections 124 provide multiple current paths between a component retained by the holder 110 and the circuit on the printed circuit board. The increased dimensions of the terminal section 122 allow the terminal section to carry more current making holder 110 better suited to high current-carrying applications.

Figure 8:
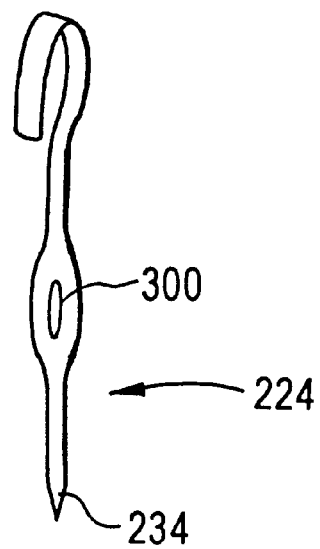
FIG. 8 is a perspective view of an alternative embodiment of a contact for the holder of FIG. 1.

Although the aperture engaging sections of the contacts have been described as including C-shaped sections to conform to the inside diameter of the plated through-holes in the printed circuit board, it should be appreciated that other aperture engaging section configurations, which allow the aperture engaging sections to be press-fit into the plated through-holes to form the desired solderless mechanical and low resistance electrical connection between the holder and printed circuit board, can be used. For example, as can be seen in FIG. 8, the aperture engaging section 224 of each contact, may resemble a needle with a "hole" or "eye" 300 being provided in the aperture engaging section above the tail 234 to allow the aperture engaging section to deform when press-fit into plated through-holes and establish the desired solderless electrical and mechanical connection.

The present invention provides advantages in that components accommodated by the holder can be removed and replaced quickly and easily without requiring the holder to be removed from the printed circuit board. Also, the design of the holder allows the holder to be manufactured easily and inexpensively while still allowing the desired mechanical and solderless low resistance electrical connection between the holder and the printed circuit board to be made.

It will be appreciated by those of skill in the art that other modifications and variations may be made to the present invention without departing from the spirit and scope thereof as defined by the appended claims.

I claim:

1. A holder for holding an electrical component having terminals on ends thereof, said holder being engageable with a printed circuit board having plated through-holes formed therein, said holder comprising:

an insulated body to receive the electrical component, at least two laterally spaced electrically conductive contacts accommodated by said body, each of said contacts including:

at least one aperture engaging section extending beyond a surface of said body to frictionally engage with a respective plated through-hole in the printed circuit board to form a solderless electrical and mechanical connection therewith and a resilient terminal section to contact a respective terminal of the component and retain the component received by said body, said terminal sections are in the form of open loops and a restoring force is presented on said loops when compressed to bias said loops against said component.

2. A holder as defined in claim 1 wherein said body is formed of plastic material.

3. A holder as defined in claim 2 wherein said body has an elongate recess provided in an upper surface thereof to receive said component.

4. A holder as defined in claim 3 further including at least one access provided in at least one wall of said body adjacent said recess to facilitate removal of a component accommodated by said recess.

5. A holder as defined in claim 4 wherein said at least one access is in the form of a notch or window provided in said at least one wall.

6. A holder as define in claim 1 wherein said terminal sections are compressed when the component is accommodated by said body.

7. A holder as defined in claim 1 wherein said at least one aperture engaging sections include C-shaped sections formed by oppositely extending arcuate arms which taper in reduced cross-sectional thickness towards their ends, said arms providing generally uniformly stressed beam sections which allow the outer diameter of said C-shaped sections to conform to an inside diameter of a respective one of said plated through-holes into which said aperture engaging ends are inserted.

8. A holder as defined in claim 1 wherein each of said contacts includes a pair of aperture engaging sections.

9. A holder as defined in claim 1 wherein said terminal sections are in the form of loops and wherein a restoring force is presented on said loops when compressed.

10. A holder as defined in claim 9 wherein said at least one aperture engaging sections include C-shaped sections formed by oppositely extending arcuate arms which taper in reduced cross-sectional thickness towards their ends, said arms providing generally uniformly stressed beam sections which allow the outer diameter of said C-shaped sections to conform to the inside diameter of plated holes into which said contacts are inserted.

11. A holder as defined in claim 1 wherein said terminal sections are in the form of loops and wherein a restoring force is presented on said loops when compressed to bias said loops against said component.

12. A holder as defined in claim 1 wherein said at least one aperture engaging sections include C-shaped sections formed by oppositely extending arcuate arms which taper in reduced cross-sectional thickness towards their ends, said arms providing generally uniformly stressed beam sections which allow the outer diameter of said C-shaped sections to conform to the inside diameter of plated holes into which said contacts are inserted.

13. The holder of claim 1, wherein said at least one aperture engaging section and said terminal section integrally form said electrically conductive contact.

14. The holder of claim 11, wherein said loops are open loops.

15. The holder as defined in claim 1, wherein said terminal sections do not overlie the electrical component.

16. A holder for holding an electrical component having terminals on ends thereof, said holder being engageable with a printed circuit board having plated through-holes formed therein, said holder comprising:
an insulated body to receive the electrical component,
at least two laterally spaced electrically conductive contacts accommodated by said body, each of said contacts including:
at least one aperture engaging section extending beyond a surface of said body to frictionally engage with a respective plated through-hole in the printed circuit board to form a solderless electrical and mechanical connection therewith and
a resilient terminal section to contact a respective terminal of the component and retain the component received by said body, said terminal sections are in the form of open loops and a restoring force is presented on said loops when compressed to bias said loops against said component,
wherein said at least one aperture engaging section includes C-shaped sections formed by oppositely extending arcuate arms which taper in reduced cross-sectional thickness towards their ends, said arms providing generally uniformly stressed beam sections which allow the outer diameter of said C-shaped sections to conform to an inside diameter of a respective one of said plated through-holes into which said aperture engaging ends are inserted.

17. A holder as defined in claim 16 wherein said body is formed of plastic material.

18. A holder as defined in claim 16, wherein said terminal sections are in the form of open loops and wherein a restoring force is presented on said loops when compressed to bias said loops against said component.

19. A holder as defined in claim 16, wherein said terminal sections are in the form of loops and wherein a restoring force is presented on said loops when compressed.

20. A holder as defined in claim 16, wherein said body has an elongate recess provided in an upper surface thereof to receive said component.

21. The holder of claim 16, wherein said at least one aperture engaging section and said terminal section integrally form said electrically conductive contact.

22. The holder of claim 16, wherein said loops are open loops.

23. The holder as defined in claim 16, wherein said terminal sections do not overlie the electrical component.

24. A holder for holding an electrical component having terminals on ends thereof, said holder being engageable with a printed circuit board having plated through-holes formed therein, said holder comprising:
an insulated body to receive the electrical component,
at least two laterally spaced electrically conductive contacts accommodated by said body, each of said contacts including:
at least one aperture engaging section extending beyond a surface of said body to frictionally engage with a respective plated through-hole in the printed circuit board to form a solderless electrical and mechanical connection therewith and
a resilient terminal section to contact a respective terminal of the component;
wherein said terminal sections are in the form of loops and wherein a restoring force is presented on said loops when compressed.

25. A holder as defined in claim 24, wherein said terminal sections are in the form of open loops and wherein a restoring force is presented on said loops when compressed to bias said loops against said component.

26. A holder as defined in claim 24, wherein said terminal sections are in the form of loops and wherein a restoring force is presented on said loops when compressed.

27. A holder as defined in claim 24, wherein said body has an elongate recess provided in an upper surface thereof to receive said component.

28. The holder of claim 24, wherein, said at least one aperture engaging section and said terminal section integrally form said electrically conductive contact.

29. The holder of claim 24, wherein said loops are open loops.

30. The holder as defined in claim 24, wherein said terminal sections do not overlie the electrical component.

* * * * *